United States Patent [19]

Kato

[11] Patent Number: 5,266,827
[45] Date of Patent: Nov. 30, 1993

[54] SEMICONDUCTOR PRESSURE SENSOR ASSEMBLY HAVING AN IMPROVED PACKAGE STRUCTURE

[75] Inventor: Kazuyuki Kato, Kanagawa, Japan

[73] Assignee: Fuji Electric Co., Ltd., Kanagawa, Japan

[21] Appl. No.: 24,454

[22] Filed: Mar. 1, 1993

[30] Foreign Application Priority Data

Apr. 16, 1992 [JP] Japan .................................. 4-095703

[51] Int. Cl.⁵ .......................................... H01L 29/84
[52] U.S. Cl. ................................. 257/417; 257/419;
257/687; 257/788; 257/791; 73/517 R; 73/726;
437/219; 437/224
[58] Field of Search ............... 257/417, 419, 788, 791,
257/687, 787; 73/517 R, 720, 721, 726, 727;
437/219, 224, 211, 207, 212

[56] References Cited

U.S. PATENT DOCUMENTS

| 4,249,034 | 2/1981 | Fichot et al. | 257/687 X |
| 4,723,899 | 2/1988 | Osada | 425/116 |
| 4,850,227 | 7/1989 | Luehgen et al. | 73/721 X |
| 4,895,026 | 1/1990 | Tada | 73/721 |
| 5,173,766 | 12/1992 | Long et al. | 257/687 |

FOREIGN PATENT DOCUMENTS

| 3718172 | 12/1988 | Fed. Rep. of Germany | 257/788 |
| 56-55831 | 5/1981 | Japan | 73/720 |
| 58-151035 | 9/1983 | Japan | 437/219 |
| 60-153180 | 8/1985 | Japan | 257/419 |
| 3-263840 | 1/1991 | Japan . | |
| 3-060146 | 3/1991 | Japan | 257/787 |

*Primary Examiner*—William Mintel
*Attorney, Agent, or Firm*—Finnegan, Henderson, Farabow, Garrett & Dunner

[57] ABSTRACT

A semiconductor pressure sensor assembly, comprising a receptacle having a floor and including a first cavity recessed within a first portion of the floor, and a second cavity recessed within a second portion of the floor and connected to the first cavity at a first junction. A semiconductor pressure sensor is within the first cavity, and a plurality of bonding pads are disposed about a periphery of a top surface of the pressure sensor chip other than at a location of the first junction. A plurality of external conducting terminals are disposed about a periphery of the receptacle other than at the location of the first junction, and a plurality of wires connect the external conducting terminals to respective ones of the bonding pads. A gelatinous material is within the first and second cavities, and the second cavity serves as a first work region from which an excess of the gelatinous material within the first cavity can be removed.

5 Claims, 2 Drawing Sheets

SEMICONDUCTOR PRESSURE SENSOR ASSEMBLY HAVING AN IMPROVED PACKAGE STRUCTURE

BACKGROUND OF THE INVENTION

1. Field of the Invention

The present invention relates to a semiconductor pressure sensor assembly, and, more specifically, to a package structure of a semiconductor pressure sensor assembly.

2. Description of the Related Art

Semiconductor pressure sensors such as contact-type pressure sensors are well known in the art. For example, contact-type semiconductor pressure sensor chips made by lo diffusing a semiconductor piezoelectric crystal resistor, i e., a "distortion gauge resistor", on a thin diaphragm formed in a portion of a silicon substrate are well known. In such a semiconductor pressure sensor chip, pressure applied to the chip causes the resistance of the distortion gauge resistor to vary, and such changes in resistance are converted into an electric signal which can be used to measure the pressure.

FIGS. 5-6 illustrate a conventional assembly of the above-described semiconductor pressure sensor. As shown in FIGS. 5-6, the assembly comprises a semiconductor pressure sensor chip 1 mounted on a glass base 2, a plurality of bonding pads 1a formed on a top surface of the sensor chip 1, external conducting terminals 3, and aluminum wires 4 for connecting the bonding pads 1a to the external conducting terminals 3. As also shown in FIGS. 5-6, the assembly further comprises a receptacle 5 comprising, for example, a portion of a resin dual in-line package, having a cavity 5a recessed in its floor, a lid 6 having a pressure application hole 6a formed therethrough, and a silicone gel 7 for protecting the surface of the sensor chip 1.

The semiconductor pressure sensor chip 1 is hermetically joined to an upper surface of the glass base 2 such that a concave space of the substrate on which a diaphragm has been formed is directed toward a lower plane. The glass base 2 is joined, via an adhesive agent, at the floor of the cavity 5a. The external conducting terminals 3 are arranged about the periphery of the receptacle 5 so as to surround the cavity 5a and the sensor chip 1. It should be noted that it is desirable that the depth of the cavity 5a be such that the height of the sensor chip 1 when mounted on the glass base 2 within the cavity 5a and the height of the external conducting terminals 3 are substantially the same within the receptacle 5. It should also be noted that the silicone gel 7 protects the sensor chip 1 and the aluminum wire 4 from dust and humidity which can reach the sensor chip 1 through the pressure application hole 6a.

The method for providing the assembly illustrated in FIGS. 5-6 is as follows. First, the sensor chip 1 and the base 2 are assembled in the cavity 5a. Next, the aluminum wires 4 are bonded between the bonding pads 1a of the sensor chip 1 and the external conducting terminals 3. Next, a proper amount of the silicone gel 7 is potted into the receptacle 5 so as to cover the surface of the sensor chip 1 and the aluminum wires 4. Finally, after the silicone gel 7 has been cured, the lid 6 is attached to the receptacle 5.

It should be noted that, when the silicone gel 7 is potted into the receptacle 5, care must be taken to maintain the precision of the sensor chip 1. More specifically, because the silicone gel 7 still maintains a somewhat gelatin state even after being cured, pressure externally applied through the pressure application hole 6a to the sensor chip 1 is more or less attenuated by the silicone gel 7. Moreover, the dynamic characteristics of the silicone gel 7 will tend to vary when subjected to heat and humidity as a function of the thickness of the silicone gel 7, thereby altering the measuring precision of the sensor chip 1. Accordingly, to increase the precision of the sensor chip 1, it is desirable that the silicone gel 7 be made as thin as possible.

In an effort to minimize the thickness of the silicone gel 7, Applicants have attempted to remove excess amounts of the silicone gel 7 from the receptacle 5 before the silicone gel 7 is cured using a vacuum device having a specially adapted suction nozzle 9. More specifically, the suction nozzle 9 of the vacuum device is positioned within the circumference of the sensor chip 1 such that the silicone gel 7 is removed from the receptacle 5 until a layer of only several tens of micrometers of the silicon gel 7 is left to cover the surface of the sensor chip 1. It should be noted that, although the aluminum wires 4 may still extend above the upper surface of the remaining layer of the silicon gel 7, because the silicon gel 7 has adhesive characteristics, it is still possible for the surfaces of the aluminum wires 4 to be coated with the silicone gel 7.

A problem with the foregoing approach to minimizing the thickness of the silicone gel 7 in the conventional assembly of FIGS. 5-6 is that the positioning of the aluminum wires 4 and the external conducting terminals 3, in addition to the small size of the sensor chip 1, e.g., 3 mm × 3 mm, make positioning of the suction nozzle 9 within the cavity 5a extremely difficult. In particular, it is practically impossible to position the suction nozzle 9 within the circumference of the sensor chip 1 without touching the aluminum wires 4 and the sensor chip 1. As a result, the surface of the sensor chip 1 may be damaged and the aluminum wires 4 may be deformed or even disconnected.

SUMMARY OF THE INVENTION

Accordingly, it is an object of the present invention to provide an improved semiconductor pressure sensor assembly which overcomes the above-described problems associated with the conventional assembly.

Another object of the present invention to provide an improved package structure for use with a semiconductor pressure sensor assembly.

Additional objects and advantages of the invention will be set forth in part in the description which follows, and in part will be obvious from the description or may be learned by practice of the invention. The objects and advantages of the invention may be realized and attained by means of the elements and combinations particularly pointed out in the appended claims.

To achieve the foregoing objects, and in accordance with the purposes of the invention as embodied and broadly described here, a semiconductor pressure sensor assembly is provided, comprising a receptacle having a floor and including a first cavity recessed within a first portion of the floor, and a second cavity recessed within a second portion of the floor and connected to the first cavity at a first junction; a semiconductor pressure sensor within the first cavity; a plurality of bonding pads disposed about a periphery of a top surface of the pressure sensor chip other than at a location of the first junction; a plurality of external conducting terminals disposed about a periphery of the receptacle other than at the location of the first junction; a plurality of wires connecting the external conducting terminals to respective ones of the bonding pads; and a gelatinous material within the first and second cavities; wherein the second cavity serves as a first work region from which an excess of the gelatinous material within the first cavity can be removed.

Preferably, the semiconductor pressure sensor assembly further comprises a third cavity recessed within a third portion of the floor and connected to the first cavity at a second junction, wherein the plurality of bonding pads are disposed about the periphery of the top surface of the pressure sensor chip other than at the location of the first junction and a location of the second junction; the plurality of external conducting terminals are disposed about the periphery of the receptacle other than at the location of the first junction and the location of the second junction; the gelatinous material is within the first, second, and third cavities; and the third cavity serves as a second work region from which the excess of the gelatinous material within the first cavity can be removed.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention. In the drawings.

DETAILED DESCRIPTION OF PREFERRED EMBODIMENTS

Figure 1:
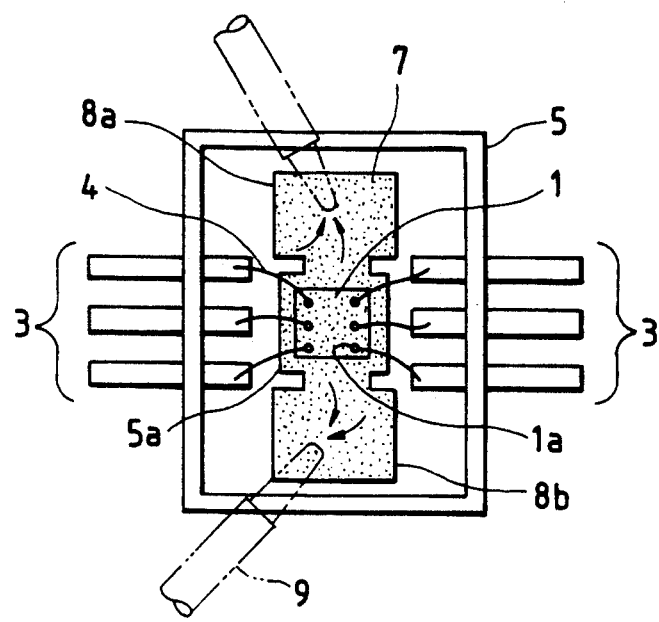
FIG. 1 is a plan view of a semiconductor pressure sensor assembly according to a first embodiment of the present invention, having its lid removed.

Reference will now be made in detail to the presently preferred embodiments of the invention as illustrated in the accompanying drawings, in which like reference characters designate like or corresponding parts throughout the several drawings.

Figure 2:
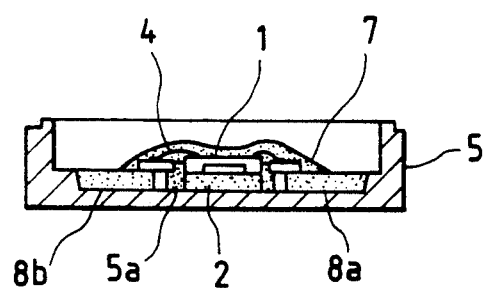
FIG. 2 is a cross sectional view of the semiconductor pressure sensor assembly of FIG. 1.
Figure 3:
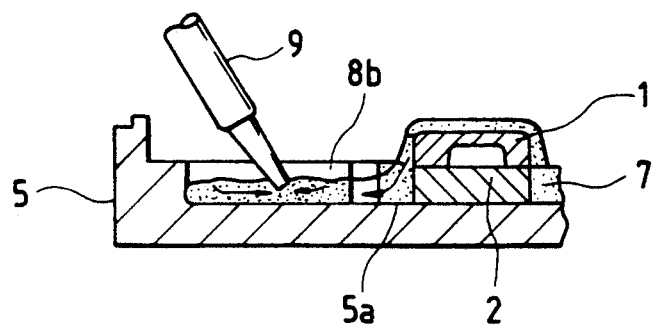
FIG. 3 is an explanatory diagram for illustrating a sucking operation performed on the semiconductor pressure sensor assembly of FIG. 1.

As shown in FIGS. 1-3, there is provided a semiconductor pressure sensor assembly according to a first embodiment of the present invention. The assembly comprises a receptacle 5 which, preferably, has a rectangular shape, a cavity 5a centrally recessed within the floor of the receptacle 5, and a semiconductor pressure sensor chip 1 mounted on a glass base 2 and within the cavity 5a. External conducting terminals 3 are arranged on right and left edges of the receptacle 5, and bonding pads 1a are arranged on right and left edges of the sensor chip 1. Further, cavities 8a and 8b are additionally recessed within the floor of the receptacle 5, preferably, adjacent to top and bottom edges, respectively, of the cavity 5a. Preferably, the depths of the cavities 8a and 8b are the same as that of the cavity 5a, and the junctions between the cavity 5a and the cavities 8a and 8b are narrowed to facilitate the positioning of the sensor chip 1 within the cavity 5a.

It should be noted that the bonding pads 1a formed on the top surface of the sensor chip 1 are, preferably, disposed about a periphery of the top surface of the sensor chip 1, but not at the locations of the junctions between the cavities 5a and 8a and 8b. Likewise, the external conducting terminals 3 and wires 4 are also, preferably, disposed about a periphery of the receptacle 5, but not at the locations of the junctions between the cavities 5a and 8a and 8b.

With the above-described structure, when a silicone gel 7 is potted into the receptacle 5 to cover the sensor chip 1, external conducting terminals 3, and wires 4, excess amounts of the silicone gel 7 can be easily removed from the cavity 5a by positioning a suction nozzle 9 of a vacuum device, preferably at an inclined direction, into one or both of the cavities 8a and 8b. As shown in FIG. 3, as the silicone gel 7 in the cavities 8a and 8b is removed, excess amounts of the silicone gel 7 in the cavity 5a flow into the cavities 8a and 8b. Preferably, removal of the silicone gel 7 from the cavities 8a and 8b, and thus from cavity 5a, is terminated when a layer of only several tens of micrometers of the silicon gel 7 is left to cover the surface of the sensor chip 1 and the wires 4.

It should be appreciated from the foregoing description of the first embodiment of the present invention that the positioning of the bonding pads 1a about the periphery of the top surface of the sensor chip 1, as well as the positioning of the external conducting terminals 3 and wires 4 about the periphery of the receptacle 5, enables the removal of excess amounts of the silicone gel 7 from the cavity 5a without positioning the suction nozzle 9 within the cavity 5a and, thus, without disturbing the sensor chip 1, the external conducting terminals 3, or the wires 4. In addition, because the suction nozzle 9 can be applied to both of the cavities 8a and 8b, removal of the silicone gel 7 from the cavity 5a can be performed quickly and efficiently.

Figure 4:
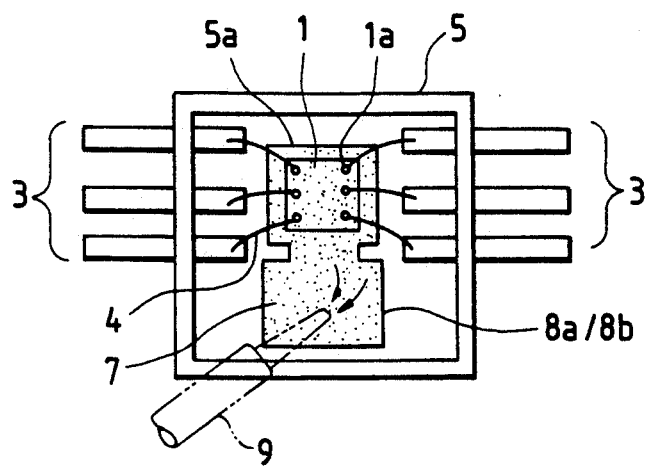
FIG. 4 is plan view of a semiconductor pressure sensor assembly according to a second embodiment of the present invention.
Figure 5:
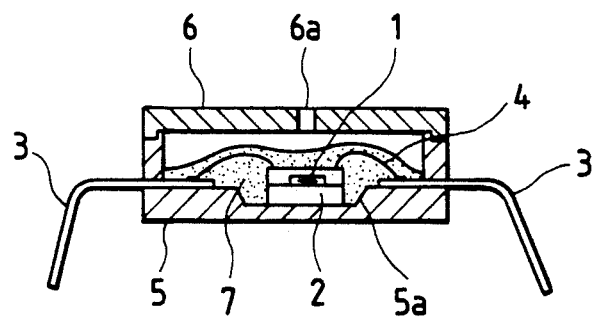
FIG. 5 is a cross sectional view of a conventional semiconductor pressure sensor assembly.
Figure 6:
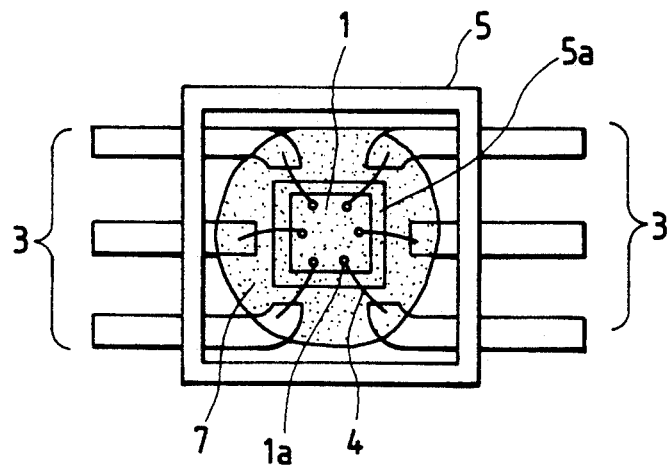
FIG. 6 is a plan view of the conventional semiconductor pressure sensor assembly of FIG. 5, having its lid removed.

As shown in FIG. 4, there is provided a semiconductor pressure sensor assembly according to a second embodiment of the present invention. The assembly of FIG. 4 differs from that of FIGS. 1-3 in that only one of the cavities 8a and 8b is provided within the floor of the receptacle 5. Further, although not shown in FIG. 4, the bonding pads 1a, external conducting terminals 3, and wires 4 of the assembly of FIG. 4 need not be arranged only along the right and left edges of the sensor chip 1 and receptacle 5 as in the first embodiment. Rather, the bonding pads 1a, external conducting terminals 3, and wires 4 can also be arranged along the upper edges of the sensor chip 1 and receptacle 5.

It should be noted that, because the assembly of FIG. 4 is provided with only one of the cavities 8a and 8b, the rate at which excess amounts of the silicone gel 7 can be removed from the cavity 5a is less than that of the first embodiment. However, because only one of the cavities 8a and 8b is provided, the overall dimensions of the assembly can be minimized. It should further be noted that, because the bonding pads 1a of the assembly of FIG. 4 are not always arranged only on the right and left edges which are located opposite to the external conducting terminals 3, the external conducting terminals 3 and wires 4 need not be arranged only along the right and left edges of the receptacle 5. Thus, the number of bonding pads, external conducting terminals, and wires can be increased over that of the first embodiment.

Additional advantages and modifications will readily occur to those skilled in the art. For example, the shapes and sizes of the cavities 5a, 8a and 8b, as well as their respective positions within the floor of the receptacle 5, can be varied to provide any number of arrangements while still providing the benefits of the present invention. Likewise, the positioning of the external conducting terminals 3 and the wires 4 can also be varied. Therefore, the invention in its broader aspects is not limited to the specific details, representative devices, and illustrative examples shown and described. Accordingly, departures may be made from such details without departing from the spirit or scope of the general inventive concept as defined by the appended claims and their equivalents.

What is claimed is:

1. A semiconductor pressure sensor assembly, comprising:
    a receptacle having a floor and including a first cavity recessed within a first portion of said floor, and a second cavity recessed within a second portion of said floor and connected to said first cavity at a first junction;
    a semiconductor pressure sensor within said first cavity;
    a plurality of bonding pads disposed about a periphery of a top surface of said pressure sensor chip other than at a location of said first junction;
    a plurality of external conducting terminals disposed about a periphery of said receptacle other than at said location of said first junction;
    a plurality of wires connecting said external conducting terminals to respective ones of said bonding pads; and
    a gelatinous material within said first and second cavities;
    wherein said second cavity serves as a first work region from which an excess of said gelatinous material within said first cavity can be removed.

2. The semiconductor pressure sensor assembly as claimed in claim 1, further comprising a third cavity recessed within a third portion of said floor and connected to said first cavity at a second junction, wherein:
    said plurality of bonding pads are disposed about said periphery of said top surface of said pressure sensor chip other than at said location of said first junction and a location of said second junction;
    said plurality of external conducting terminals are disposed about said periphery of said receptacle other than at said location of said first junction and a location of said second junction;
    said gelatinous material is within said first, second, and third cavities; and
    said third cavity serves as a second work region from which said excess of said gelatinous material within said first cavity can be removed.

3. The semiconductor pressure sensor assembly as claimed in claim 2, wherein said location of said first junction is opposite from said location of said second junction with respect to said first cavity.

4. The semiconductor pressure sensor assembly as claimed in claim 1 or 2, wherein said gelatinous material comprises a silicone gel.

5. The semiconductor pressure sensor assembly as claimed in claim 1 or 2, wherein said receptacle comprises a portion of a dual in-line package.

* * * * *